United States Patent

Heinrich et al.

(10) Patent No.: US 6,622,845 B1
(45) Date of Patent: Sep. 23, 2003

(54) TRANSPORT SYSTEM AND METHOD FOR CONTROLLING THE TRANSPORT SYSTEM

(75) Inventors: Harald Heinrich, Potsdam (DE); Peter Österreich, Coswig (DE); Jörg Recklies, Neuwürschnitz (DE); Falk Odrich, Dresden (DE); Andre Welzk, Dresden (DE)

(73) Assignee: Siemens Aktiengesellschaft, Munich (DE)

( * ) Notice: Subject to any disclaimer, the term of this patent is extended or adjusted under 35 U.S.C. 154(b) by 600 days.

(21) Appl. No.: 09/123,908

(22) Filed: Jul. 28, 1998

(30) Foreign Application Priority Data

Jul. 28, 1997 (EP) .............................. 97112966

(51) Int. Cl.⁷ ............................................. B65G 32/00
(52) U.S. Cl. ........................................ 198/349; 198/358
(58) Field of Search .................... 198/358, 349, 198/350, 465.1, 465.4, 340, 341.03, 341.07, 341.01

(56) References Cited

U.S. PATENT DOCUMENTS

| | | | |
|---|---|---|---|
| 3,530,571 A | * 9/1970 | Perry | 198/349 |
| 3,576,540 A | 4/1971 | Fair et al. | |
| 4,646,245 A | * 2/1987 | Prodel et al. | 198/349 |
| 4,719,694 A | 1/1988 | Herberich et al. | |
| 4,805,759 A | 2/1989 | Rochet et al. | |
| 4,884,674 A | * 12/1989 | Head | 198/341.01 |
| 4,917,556 A | 4/1990 | Stark et al. | |
| 5,109,973 A | * 5/1992 | Hirano et al. | 198/341.03 |

FOREIGN PATENT DOCUMENTS

| | | |
|---|---|---|
| DE | 3010637 A1 | 9/1981 |
| EP | 0003024 A1 | 7/1979 |

* cited by examiner

Primary Examiner—Joseph E. Valenza
(74) Attorney, Agent, or Firm—Laurence A. Greenberg; Werner H. Stemer; Gregory L. Mayback

(57) ABSTRACT

The transport system for transporting items such as carriers for wafers or wafers without carriers. Conveying devices transport the items between branching devices, which branch the items to different conveying devices and to processing devices, at which the items are processed, and to storage devices, wherein the items temporarily stored. Each item to be transported has an information medium, wherein at least one first destination address is stored. The item thus carries its own destination address and can be transported to a specific processing device that corresponds to the destination address. A first destination address is read at each inlet and outlet of the transport system (at the lifts in the example) at a processing device and a second destination address is written after the processing operation at the inlets and outlets. Each branching device uses an internal destination address list to define the branching direction in that the information medium of each item is read at each branching device. A substantial portion of the transport system control is thus effected in a decentralized manner and at the lowest control level.

25 Claims, 1 Drawing Sheet

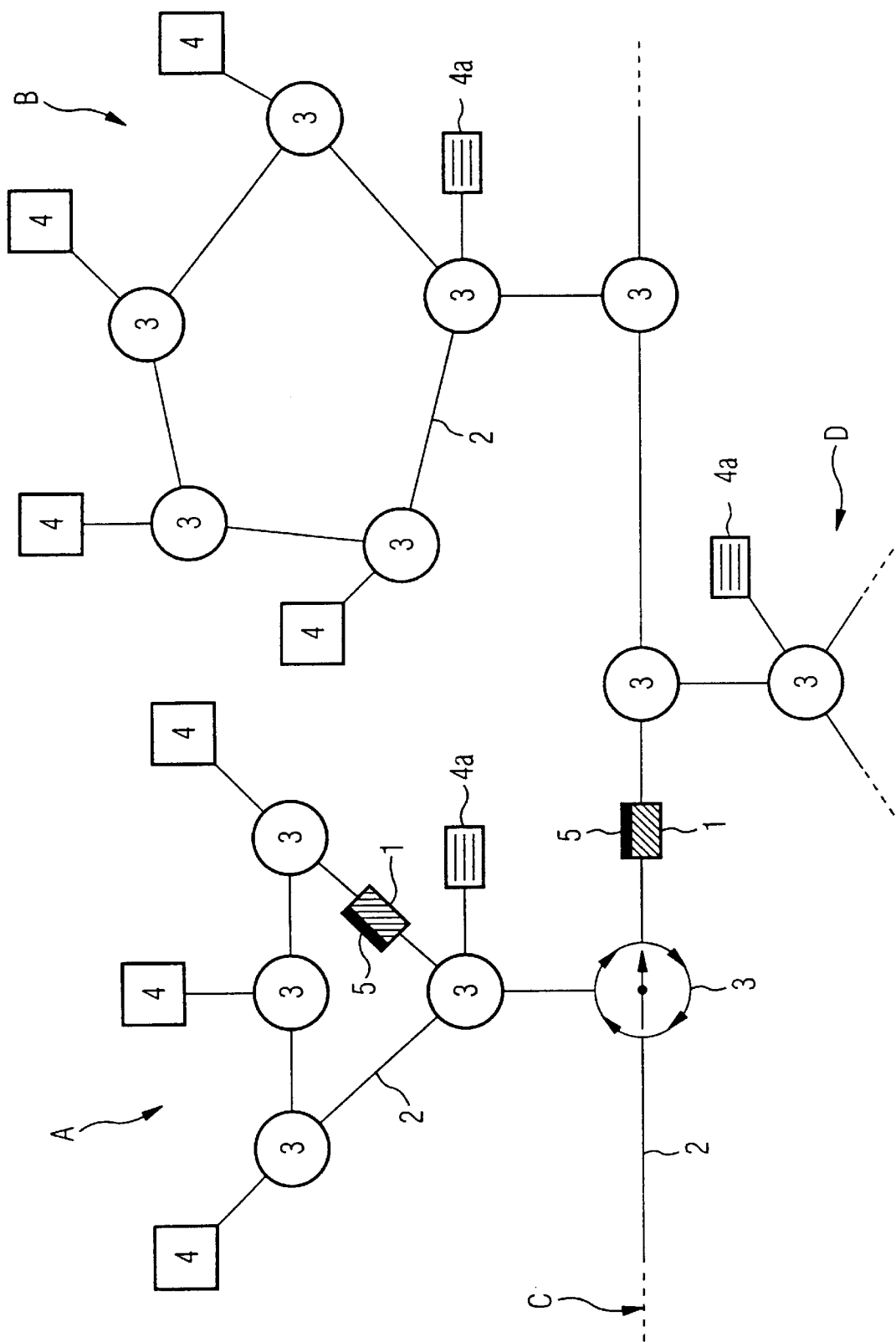

TRANSPORT SYSTEM AND METHOD FOR CONTROLLING THE TRANSPORT SYSTEM

BACKGROUND OF THE INVENTION

Field of the Invention

The invention pertains to a transport system and to a method for controlling the transport system. Such transport systems are used in the fabrication of wafers in the semiconductor field and they are an essential part of the production and automation concept.

Conventional transport systems, which are known as trolley systems, for example, have numerous disadvantages. One of the more significant disadvantages of the prior art systems resides in the fact that it is possible to expand or change the transport paths only with a high outlay, and that the control operates in a manner that is quite susceptible to faults. These disadvantages may be ascribed, inter alia, to the fact that a superordinate control unit is responsible for all the data that arise, and that the transport system is provided with too few control points which could enable monitoring of the individual trolleys. In the event of a fault, fault propagation occurs and can lead to a failure of the complete transport system and an attendant breakdown on account of the small number of control points and on account of the extensive system communication which has to be processed by a superordinate control unit.

SUMMARY OF THE INVENTION

It is accordingly an object of the invention to provide a transport system and a control method for controlling the transport system, which overcomes the above-mentioned disadvantages of the prior art devices and methods of this general type and which ensures the robustness of the system and the remainder of the system continues to operate in a dependable manner even in the event of a fault or the failure of individual components.

With the foregoing and other objects in view there is provided, in accordance with the invention, a transport system for transporting a multiplicity of individual items, comprising:

- a multiplicity of conveying devices for transporting individual items;
- a multiplicity of branching devices connected to respective conveying devices for selectively branching the items to different conveying devices;
- a multiplicity of processing devices for processing the items, the processing devices having inlets and outlets connected to respective conveying devices;
- a multiplicity of storage devices for temporarily storing the items;
- an information medium attached to each item for storing at least one first destination address identifying a specific processing device to which the respective item is to be transported;
- a writing device at each outlet of a respective processing device for writing a second destination address after a processing operation and upon transferring the item to a respective conveying device; and
- each branching device reading the information medium of each item and utilizing an internal destination address list to define a branching direction for the respective item.

In other words, the transport system is used in particular to transport wafers and it comprises a multiplicity of carrier devices which accommodate the wafers, a multiplicity of conveying devices, which transport the carrier devices, a multiplicity of branching devices, which branch the carrier devices to different conveying devices, a multiplicity of inlets and outlets (lifts) at processing devices, at which the wafers are processed, and a multiplicity of storage devices, in which the carrier devices with the wafers are temporarily stored. Each carrier device has an information medium, in which at least one first destination address is stored, with the result that the associated wafers can be transported to a specific processing device corresponding to this destination address. The first destination address is read at each lift at a processing device, and a second destination address is written after the processing operation by the lift, and each branching device uses an internal destination address list to define the branching direction in that the information medium of each carrier device is read at each branching device.

In accordance with an added feature of the invention, the second destination address corresponds to a production area, the item to be transported being processed at the first destination address and then transported to a first storage device of this production area.

In accordance with an additional feature of the invention, if the first storage device of this production area is occupied, the item to be transported successively selects all the other storage devices of this production area until a free storage location is reached.

These features serve the purpose of independent control. The transport organization is thus executed at a lowest control level of the transport system.

In accordance with another feature of the invention, the item is transported in a circle in the afore-mentioned production area if all the storage devices are occupied. This has the effect that the conveying devices themselves are used as temporary stores for the items.

In accordance with a further feature of the invention, the destination address lists in each branching device are set up in a specific manner and include all the destinations which can be reached via the specific branching device. In accordance with again a further feature of the invention, the destination address lists include only the destinations which cannot be reached in a preferred direction of the branching device. This results in optimization of the address lists so that, on the one hand, their size is kept small and, on the other hand, alternative routes can nevertheless be traveled.

In accordance with again an added feature of the invention, a further improvement in route planning is afforded where each branching device additionally takes account of the activities of neighboring branching devices when the branching direction is determined, in order to optimize the transporting path. In analogy to traffic control, transport paths which are already severely loaded can be circumvented.

In accordance with again an additional feature of the invention, the content of the information medium on the item is nonvolatile. The destination addresses are thus retained and the transport task can be resumed even after a power failure.

In order to be able to react suitably to exceptional situations, according to again another feature, the transport system comprises additional address lists in each branching device, which address lists can be activated in exceptional situations, such as fire alarm, deactivation of the transport system and partial deactivations of the transport system. Furthermore, the destination address lists and the additional address lists may be continuously updated in order constantly to register changes in the set-up of the transport system.

Transport reliability may be further improved, in accordance with additional features of the invention, which ensure that transport tasks which are en route for an exceptionally long time are ascertained, in which case a transport task is begun by removal of the item from the storage device, the destination addresses are written to the information medium of that item, the item is transported by means of the conveying devices and is branched in the direction of the first destination address by means of the branching devices, processing being carried out after the processing device corresponding to the first destination address has been reached, and then the item is provided with the second destination address in order to be transported further. If the time interval between removal from storage and processing is longer than a predetermined time period, the item is placed onto a fault list.

In order to unambiguously identify the item to be transported, each item is allocated a specific number which is likewise stored in the information medium, this number being entered in the above-mentioned fault list.

With the above and other objects in view there is also provided, in accordance with the invention, a method of controlling a transport system which comprises the following steps:

- removing an item to be transported from a storage device;
- storing at least a first destination address in an information medium of the item;
- transporting the item along a multiplicity of conveying devices;
- reading-out the destination address from the information medium of the item at one of a multiplicity of branching devices disposed between the conveying devices;
- comparing the destination address obtained in the reading-out step with an internal destination address list in the branching device;
- setting a branching direction of the branching device depending on a result obtained in the comparing step, and branching the item in a direction towards the first destination address;
- repeating the transporting, reading-out, comparing, and setting steps until a processing device corresponding to the destination address has been reached;
- processing the item in the processing device;
- storing and/or reading a second destination address at the information medium of the item, and transporting the item further towards the second destination address.

In other words, the transport control process is characterized by the following: Removal of an item to be transported from a storage device, storage of at least one first destination address in the information medium, transporting of the item by means of a multiplicity of conveying devices, wherein the branching devices branch the item to different conveying devices, read-out of the destination address from the information medium of the item at each branching device, comparison of the destination address which has been read with an internal destination address list in the branching device, setting of the branching direction of the branching device depending on the result of this comparison, and branching the item towards the first destination address, repetition of the steps transporting/read-out/comparison/ setting until a processing device corresponding to the destination address is reached, processing of the product, storage and/or reading of a second destination address in and/or from the information medium in order to transport the item onward to a further production area.

In accordance with yet an added feature of the invention, the respective internal destination address lists include all the destinations which can be reached via the branching devices. This leads to the optimization of the transporting paths and makes possible alternative routing of the items.

In order to minimize communication in the system, it is possible, in accordance with yet an additional feature of the invention, for a second destination address to be written together with the first destination address to the information medium during the removal from storage operation, and for the first destination address then to be replaced or overwritten by the second destination address after the processing operation.

According to the fundamental concept of the present invention, namely that of realizing decentralized transport control at a lowest control level, the branching device uses the internal destination address list to determine the branching direction, independently of a superordinate control device. In accordance with yet a further feature of the invention, therefore, the superordinate control device updates the destination address list in the branching devices when the configuration (expansion, alteration, partial or complete deactivation of transporting paths, additional branching devices, etc.) of the transport system changes.

In accordance with a concomitant feature of the invention, further address lists are stored in the branching devices in addition to the internal destination address lists, and can be activated in exceptional cases, such as, for example, fire alarm or (partial) deactivation of the transport system.

Other features which are considered as characteristic for the invention are set forth in the appended claims.

Although the invention is illustrated and described herein as embodied in a transport system and method for controlling the transport system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing FIGURE.

BRIEF DESCRIPTION OF THE DRAWING

The sole FIGURE is a diagrammatic view illustrates parts of the novel transport system.

DESCRIPTION OF THE PREFERRED EMBODIMENTS

Referring now to the FIGURE of the drawing in detail, there are seen various symbolically indicated components of a transport system. Reference numeral 1 designates an item to be transported (in the exemplary best mode embodiment, the item is a carrier for one or more wafers). The item 1 is transported by means of a plurality of conveying devices 2 (conveyors in the exemplary embodiment). The item 1 can be transported to any desired processing device 4 (for instance, up to the lift at the processing device in the exemplary embodiment) or storage devices 4a (for instance, stockers in the example). Branching devices 3 (for example rotary indexing tables) are disposed between the various conveying devices 2. The branching devices 3 branch the items 1 into different directions. Each item 1 is provided with an information medium 5 (a so-called tag in the exemplary embodiment), which has stored at least the address of the next processing device 4 to be called at. A reading device is provided at each branching device 3 which can read the information medium 5 of the item 1. The branching direction can thereby be determined by comparing a destination address list stored internally in each of the branching devices 3 which the address read out from the tag. The branching device 3 is rotated correspondingly and the item 1 is conveyed in the direction of the processing device 4 to be called at.

The following terms are briefly explained in order to provide a better understanding:

ITEM TO BE TRANSPORTED: A carrier device with or without the product to be transported, or the product itself if no carrier device is present (in the exemplary best mode embodiment, the item to be transported is a carrier which accommodates the product to be processed, the wafers).

INLET AND OUTLET OF THE TRANSPORT SYSTEM: Points at which the item to be transported leaves the transport system and enters the system (in the exemplary embodiment, these are transitions to the processing stations, such as lifts).

The control system is coordinated by a non-illustrated superordinate control device. The control device or control system communicates via a network connection to the storage device 4a the information which is necessary to determine which item 1 to be transported is to be removed from the storage device 4a and to which destination, that is to say to which processing device 4, the item 1 to be transported is to be sent or conveyed. Preferably, a further information item may additionally be transmitted, namely where the item 1 is to be transported after processing is complete in the processing device 4.

For this purpose, a non-illustrated writing device is provided in the storage device 4a, so that the above-mentioned information items can be written to the information medium 5 of the item 1. Each processing device 4 within the transport system is assigned a unique address.

After the item 1 to be transported has been removed from the storage device 4a, the item 1 is transported further by means of the conveying devices 2. At the branching points in the transport system defined by the branching devices 3, the information medium 5 of the item 1 is scanned with a reading device and the information regarding the destination of the item 1 to be transported is thus obtained.

The branching device 3 uses this information (destination address) read from the information medium 5 and a destination address list stored internally in the branching device 3 to determine the direction in which the item 1 to be transported is to be conveyed.

The destination address list stored internally in each branching device 3 is specific to that branching device 3 and is created in a nonvolatile manner. The destination address list is thus preserved even in the event of a power failure. The destination address list contains, in hierarchical form, all the destinations which can be reached from the specific branching device 3. In this case, it is preferable to store in the destination address list only the destination addresses which can be reached via said branching device 3 when the branching device.3 is not set or rotated in the preferred direction. This results in a reduction in the amount of information to be stored and thus a shortening of the destination address list. The preferred direction of each branching device 3 is in this case that direction in which circulating of the items 1 to be transported in the transport system is ensured, that is to say a circulatory transport which transports the item 1 to be transported again and again via the same branching devices 3. For example, the preferred direction of the bottom left branching device 3 is represented by an arrow in the FIGURE.

In addition to the destination address list, each branching device 3 may respectively be provided with a search list, a fire alarm list and a shutdown list, the structure and function of which are described further below.

These destination lists are updated if part of a production area fails, a processing device 4 fails, a conveying device 2 fails or else if the set-up of the transport system changes (addition or removal of production areas, branching devices 3, etc.).

In order to optimize the passage and the transport of the items 1 to be transported in the transport system, it is possible, in a further preferred embodiment according to the present invention, for the branching direction of the branching devices 3 to be set with account being taken of the activity and/or branching direction of neighboring branching devices. In other words, in a complex transport system in which a plurality of alternative routes are possible between current position and destination of the item 1 to be transported, that route can be pursued which leads to the destination in the shortest distance and/or the shortest time. For this purpose, as already explained above, the activities of neighboring branching devices 3, lying on an alternative transporting path, are taken into account during the setting of the branching direction at the current position of the item 1 to be transported and, for example, branching devices 3 which are already greatly frequented or utilized to capacity are circumvented.

Thus, in accordance with the principle according to the present invention, the transport of the items 1 to be transported is carried out under decentralized control, independently of the superordinate control device. After a specific item 1 is removed from the storage device 4a and the destination address is stored in the information medium 5 of the item 1 to be transported, the item 1 is transported to the destination without any further intervention on the part of the control device, in that the branching devices arranged along the transport path define the branching direction independently and with reference to the internal destination address list in order to direct the item 1 to its destination.

Consequently, continuous operation of the transport system is possible even in the event of failure of the control device, with the result that the items 1 which are located within the transport system can be conveyed further.

As soon as a specific item 1 has reached its destination, i.e., it has arrived at a processing device 4, that item 1 is logged off from the control device and after processing has been carried out, that item 1 is logged on to the control device again. A second address is simultaneously written as a new first address to the information medium 5 of the item 1, so that the item may be conveyed to a new destination.

The storage of the second address in the information medium 5 can be effected either as early as together with the storage of the first address during the removal of the item 1 from the storage device 4a or else in the event of logging on again after processing by the processing device 4, or at the lift of the exemplary embodiment.

The above-mentioned lists which can be stored in addition to the destination address lists in the branching devices 3 are described below:

SEARCH LIST: The control device can communicate a search list to each branching device 3. Using this search list, each branching device 3 can check the items 1 to be transported which are passing through and, if a specific item 1 is positioned at a specific branching device 3, report that position to the control device. For this purpose, each item 1 receives a unique number in the information medium 5. As soon as the branching device 3 has read the information medium 5 of the item 1 by means of the reading device and has ascertained by comparison with the search list that the position of the item 1 must be reported to the control device, the current position of the item 1 is signaled to the control device via the network connection.

FIRE ALARM LIST: If a fire alarm is triggered in the production area and the fire doors are closed, then a specific fire alarm list in the branching devices 3 arranged directly in front of the fire doors can be activated in dependence on either the control device or the direct signal from the fire doors. In the latter case, a reliable reaction in the event of a fire alarm is possible even in the event of failure of the control device. Using the fire alarm lists, the branching devices 3 can divert or suitably relay the items 1.

SHUTDOWN LIST: A destination list which becomes active when the transport system is stopped is stored in each branching device 3. If operation is stopped in a planned manner, these shutdown lists are activated via the control device. The shutdown lists permit a locally limited shutdown (stopping of operation or deactivation) in the transport system. If, for example, production area A (top left in the FIGURE) is intended to be shut down, for example for servicing purposes, for expansion, etc., then the upstream branching device 3 must be appropriately informed and activated and, in addition, the branching devices 3 which are located within the production area A must activate their shutdown lists in order to move any items 1 located within their sphere of influence in a controlled manner. The shutdown lists are constantly updated depending on the degree to which the storage devices 4a are filled, with the result that the system is informed in a decentralized manner (that is to say in each branching device 3) and at all times about whether the storage capacity within a production area suffices to be able to accommodate, in the event of a shutdown, all the items 1 to be transported in the storage devices 4a which are present there. Should the storage capacities within the production area A not suffice, then some of the items 1 to be transported which are located in the production area A can be transported out of the production area A by virtue of corresponding updating of the shutdown lists. After a shutdown and the subsequent startup, the items 1 to be transported which are located on the conveying devices 2 in the production area can be transported further without having to be re-identified, since independent routing is effected at the next branching device 3.

In the event of a failure or an interruption of the power supply in the production area, the items 1 remain on the conveying devices 2. Since the destination lists in the branching devices 3 and also the addresses in the information media 5 are stored in a nonvolatile manner (for example in an EEPROM), once the power supply has been re-established the items 1 to be transported can again be transported further without any intervention by the superordinate control device.

In the event of failure of the superordinate control device, all the current transport tasks can be processed since the corresponding control information is stored in a decentralized manner in the branching devices 3 and the information media 5 of the items 1 to be transported. However, in the event of failure of the superordinate control device, new transport tasks which are ordered at the storage devices 4a can only be started without superordinate monitoring.

In order to monitor and optimize the entire transport system, it is possible for a corresponding signal to be passed to the superordinate control device when an item 1 is removed from a storage device 4a. Once this signal has been received, the control device starts a timer. The time is thereby measured to ascertain whether that specific item 1 arrived at its destination within a predetermined time interval. Should this time interval be too long, then the control device puts this item 1 to be transported (or its number) onto a fault list.

There exist a wide variety of possible reasons or causes for an excessively long time interval from the removal from storage and the arrival at the destination. For instance, correct branching at the branching devices 3 will no longer be possible if the information medium 5 is partly or entirely defective. The result is that the associated item 1 to be transported circulates constantly in the preferred direction (as described at the beginning) of the branching devices 3 on the conveying devices 2. Such a defective information medium 5 prevents the read-out of the destination address, for example, with the result that the branching device 3 rotates in the preferred direction. Such an item 1 to be transported which is transported constantly in a circle can be identified by means of the fault list and, finally, removed manually from the transport system or moved to a standard fault destination. A different possibility for an excessively long time interval between the removal from storage and the arrival at the destination may be manifest if, for example, the reading device of a branching device 3 fails. Since the branching device 3 is then likewise switched to its preferred direction, correct transport in a specific direction which is not the preferred direction is no longer possible. The item 1 then likewise circulates until either the reading device of the corresponding branching device 3 functions again or the item 1 is likewise removed manually or moved to a standard fault destination.

After an item 1 has passed through final processing at a processing device 4 of a production area (for example "A" in the FIGURE), has been returned into the transport circuit and has logged onto the system, as described further above, that item 1 is conveyed to the next destination. In accordance with one embodiment according to the present invention, this new destination is a further production area (bay). The above-mentioned second address, thus, would be the name of a further production area (for example "B").

When the item 1 which has been conveyed in this way to a further production area B reaches the first storage device 4a of the production area B, then that item 1 is stored in the first storage device 4a provided that a location is present therein. If no location is present in the first storage device 4a, then the item 1 to be transported is transported to the next storage device 4a of the production area B. There it is stored, provided that a location is present. All the storage devices 4a of said production area B are selected in the same way until the item 1 again arrives at the first storage device 4a of said production area B if all the storage devices 4a are occupied. In this case, too, it is ensured by way of the timer that the carrier device 1 is put onto the fault list after a specific time interval has been exceeded. In a further embodiment, the last storage device 4a in the transport direction can automatically overwrite the destination stored in the information medium 5 of the item 1 to be transported with the next production area if relatively long circulating is undesirable.

The removal from and storage in the storage device 4a proceeds as follows: When an item 1 is removed from the storage device 4a, the associated conveying device 2 is momentarily halted in order to avoid collisions with moving items 1. When an item 1 is stored in the storage device 4a, then that item 1 is momentarily halted on the conveying device 2 if the storage device 4a has signaled that a location is free. For this purpose, a reading device and a writing device for the information medium 5 of the item 1 are provided upstream of the storage device 4a. It is advantageous that when all the storage devices 4a of a production area are occupied, the information medium 5 of the carrier device 1 can be written to anew and the carrier device 1 can be sent to a different production area. That latter instruction is given by the superordinate control device or the last storage device 4a in the transport direction.

The advantages of such a removal from storage and storage technique are that if the timer is set accordingly, the items 1 can circulate for a number of rounds in the respective production areas and may find a location in a storage device 4a even in a later round. This ensures very good capacity utilization of the storage devices 4a and an increased transport capacity of the conveying devices 2.

The robustness of the transport system and of the control of the transport system are afforded by the decentralized control of the transport of the items 1 by means of the information media 5, provided on the items 1 to be transported, and the branching devices 3, which are provided with corresponding reading devices. As soon as the destination addresses of the items 1 to be transported are stored, independent selection of the respective destinations is possible without any intervention by the superordinate control device. Consequently, lowest-level control is realized which has distinct advantages over prior art systems realized to date. These advantages are summarized further below.

The tasks of the superordinate control device can be defined as follows: Ordering transport tasks at the storage devices 4a; counting the transport tasks for each processing device 4; configuring the search lists of the branching devices 3; monitoring the timers and managing the fault lists; reconfiguring and/or activating the destination lists in the event of a fault; communicating with the fire doors; remotely configuring the control logic in the branching devices 3 and the processing devices 4 (lifts); and also communicating with higher control systems.

In order to ensure that the items 1 to be transported arrive at the individual processing devices 4 in the correct order, irrespective of the differences in the path lengths of the individual items 1 to be transported, a counter is provided for each processing device 4 and is incremented by one [1] in each case. This number is communicated together with the transport task to the storage device 4a and is written together with the first destination address to the information medium 5 of the item 1. If this item 1 reaches its destination, then the information medium 5 is read by the reading device installed there and the number of the transport task is ascertained; this number is compared with the number of the item 1 that was processed last. If the new number is one greater than the old number, then the order of the item 1 is correct and processing can be effected. However, if the difference between the old number and the new number is greater than one, then this item 1 is sent to a queue and the processing device 4 waits for the correct item 1. As a result of this comparison of transport task numbers, transport tasks can be started at the storage devices 4a with no consideration for whether the order is observed at the processing devices 4, since the processing devices 4 independently ensure that the correct order is observed and send items 1 to be transported which arrive early to the queue. This control results in a shortening of the delivery times. If the processing order of an item 1 is insignificant, then this item 1 is allocated the number 0 [zero], thereby enabling the processing devices 4 to recognize that this item 1 can be processed in an arbitrary order.

In order to prevent a missing item 1 (i.e., the next in the order) from blocking a processing device 4 since the latter constantly waits for this item 1 with the appropriate consecutive number, the counting of this processing device 4 and of the associated branching device 3 is reinitialized after a predetermined time interval has elapsed.

The advantages of the inventive transport system and of the method for controlling the transport system are as follows:

In the event of failure of a reading device of a branching device 3 or in the event of a defective information medium 5 of an item 1, the item 1 is not lost but rather circulates in the preferred direction in the transport system until the reading device functions again or the item 1 is taken manually from the conveying device 2 or is moved to a standard fault destination. The remainder of the system continues to operate with no impairment.

No problems arise in the event of a system startup following deactivation or following a power failure, since the data necessary for transport are stored in the nonvolatile information media 5 of the items 1 to be transported.

Changes (expansion, removal of individual processing devices 4 or entire production areas A, B; installation of additional branching devices 3) to the set-up of the transport system are possible at all times.

A simple solution is provided in the event of a fire alarm, so that no transport problems can arise as a result of the fire doors being closed.

If the superordinate control device fails or the network connection is disrupted, current transport tasks are not impaired and it continues to be possible to send further carrier devices 1 from the processing devices 4 in the direction of the storage devices 4a and from the storage devices 4a to the processing devices 4 (although with no monitoring).

A locally limited deactivation (shutdown) of the transport system is possible.

Should a processing device 4 fail, a fast and simple reaction is possible by changing the destination address list.

The control of the physical transporting operation is decoupled from the superordinate logistics.

The movement of the item 1 between the storage device 4a and the processing device 4 is controlled in a decentralized manner and independently of the superordinate control device.

The volume of data that arises and is to be transmitted within the transport system is reduced to a minimum.

In the normal case, the transport proceeds without any intervention on the part of the superordinate control device between the task being ordered at the (start) storage device 4a and the item 1 arriving again at the following storage device 4a.

The transport system can be expanded at any time and also in a cross-building manner.

It is possible to acquire the transport times via the timers.

Simple control of the loading or capacity utilization of the conveying devices is possible by setting the number of simultaneously possible transport tasks for each processing device (number of possible consecutive numbers in the sequence).

Alternative routing is possible.

The correct delivery order of the items 1 to be transported at a processing device 4 is ensured irrespective of the distance covered.

The conveying devices 2 can be utilized as temporary stores without burdening the control.

The programs for controlling the individual branching devices 3 relate to only a small, distinct subset of the transport system, so they are easy to develop and to maintain.

A transport system in accordance with the present invention, which is used to transport wafers in the exemplary embodiment, comprises a multiplicity of items to be transported (carrier devices which accommodate the wafers in the example), a multiplicity of conveying devices, which transport the items to be transported, a multiplicity of branching devices, which branch the items to be transported to different conveying devices, a multiplicity of processing devices, at which the items (wafers in the exemplary embodiment) are processed, and a multiplicity of storage devices, in which the items (carrier devices with the wafers) are temporarily stored, in which case each item has an information medium, in which at least one first destination address is stored, with the result that the item to be transported can be transported to a specific processing device corresponding to this destination address, this first destination address is read at each inlet and outlet of the transport system (at the lifts in the example) at a processing device and a second destination address is written after the processing operation at the inlets and outlets, and each branching device uses an internal destination address list to define the branching direction in that the information medium of each item to be transported is read at each branching device. A substantial part of the control of the transport system, that is to say the transport pursuance of the items, is in this case effected in a decentralized manner and at the lowest control level, whereby the system is designed more robustly.

To summarize, the present invention proposes shifting the straightforward transport of the carrier devices 1 to a lowest control level, with the result that the system is more robust and less prone to possible faults. The burden on the superordinate control device is relieved and, in the event of failure of that control device, the subordinate control sectors can continue to operate independently and execute the current transport tasks and bring them to an end.

We claim:

1. A transport system for transporting a multiplicity of individual items, comprising:
   a multiplicity of conveying devices for transporting individual items under a decentralized control;
   a multiplicity of branching devices connected to respective said conveying devices for selectively branching the items to different conveying devices under a decentralized control, each of said branching devices adapted to selectively branch the items dependent upon neighboring ones of said branching devices for optimizing transport distance and time;
   a multiplicity of processing devices for processing the items, said processing devices having inlets and outlets connected to respective said conveying devices;
   a multiplicity of storage devices for temporarily storing the items;
   an information medium attached to each item storing at least one first destination address identifying a specific processing device to which the respective item is to be transported for controlling transport of each item under a decentralized control;
   a writing device at each outlet of a respective one of said processing devices for writing a second destination address after a processing operation and upon transferring the item to a respective one of said conveying devices; and
   each of said branching devices having an internal destination address list and configured to read said information medium of each item and to utilize said internal destination address list to define a branching direction for the respective item.

2. The transport system according to claim 1, wherein the second destination address corresponds to a given production area, and wherein the item, after processing at the first destination address, is transported to a first storage device of the given production area.

3. The transport system according to claim 2, wherein, if the first storage device of the given production area is occupied, the item is successively driven to all other storage devices of the given production area until a free storage location is reached.

4. The transport system according to claim 3, wherein the item is transported in a circle in the given production area if the first storage device and all the other storage devices are occupied.

5. The transport system according to claim 1, wherein the destination address list in each said branching device is a specifically adapted destination address list including all destinations within the transport system that can be reached via the respective said branching device.

6. The transport system according to claim 1, wherein said branching devices each have a defined preferred conveying direction, and the destination address list includes only the destinations which cannot be reached in the preferred conveying direction of the branching device.

7. The transport system according to claim 1, wherein a transport path within the transport system is optimized by defining a conveying direction in each branching device and taking activities of neighboring branching devices into consideration in defining the respective branching direction.

8. The transport system according to claim 1, wherein the information medium is adapted to carry nonvolatile information.

9. The transport system according to claim 1, wherein each said branching device includes reading device for reading the information medium.

10. The transport system according to claim 1, wherein each inlet and outlet at said processing devices has a reading device and a writing device for the information medium.

11. The transport system according to claim 1, wherein the first destination address is read at each inlet and outlet of a respective said processing device.

12. The transport system according to claim 1, wherein each said branching device has additional address lists that are activatable in exceptional situations.

13. The transport system according to claim 12, wherein the exceptional situations include a fire alarm, deactivation of the transport system, and a partial deactivation of the transport system.

14. The transport system according to claim 12, wherein the destination address lists and the additional address lists are continuously updated in order to constantly register changes in a set-up of the transport system.

15. The transport system according to claim 1, wherein a transport operation is initiated by removing the item from said storage device, the destination addresses are written to said information medium of the item, the item is transported by said conveying devices and branched in a direction towards the first destination address by said branching devices, the item is processed in a processing device that corresponds to the first destination address, and the item is subsequently provided with the second destination address and transported towards the second destination.

16. The transport system according to claim 15, wherein, if a time interval between a removal from storage and processing of an item is longer than a predetermined time period, then the item is placed on a fault list.

17. The transport system according to claim 16, wherein the information medium stores a unique number allocated to each item, and wherein the unique number is entered in the fault list.

18. A method of controlling a transport system, which comprises:
  removing an item to be transported from a storage device;
  storing at least a first destination address in an information medium of the item;
  transporting the item along a multiplicity of conveying devices under a decentralized control;
  reading-out the destination address from the information medium of the item at one of a multiplicity of branching devices disposed between the conveying devices;
  comparing the destination address obtained in the reading-out step with an internal destination address list in the branching device;
  under a decentralized control, setting a branching direction of the branching device depending on a result obtained in the comparing step and depending upon activities of neighboring ones of the branching devices, and branching the item in a direction towards the first destination address;
  repeating the transporting, reading-out, comparing, and setting steps until a processing device corresponding to the destination address has been reached;
  processing the item in the processing device; and
  storing and/or reading a second destination address at the information medium of the item, and transporting the item further towards the second destination address under a decentralized control.

19. The method according to claim 18, which comprises defining the internal destination address list with all destinations that can be reached via the respective branching device.

20. The method according to claim 18, which comprises writing the second destination address to the information medium together with the first destination address during the removing step, and replacing or overwriting the first destination address with the second destination address after the processing step.

21. The method according to claim 18, which comprises determining the branching direction in the branching device from the internal destination address list, independently of a superordinate control device.

22. The method according to claim 21, which comprises providing a superordinate control device, and updating with the superordinate control device the destination address list in the branching devices when a configuration of the transport system changes.

23. The method according to claim 18, which comprises, in addition to the destination address lists, storing further address lists in the branching devices, and activating the further address lists in exceptional cases.

24. The method according to claim 23, which comprises selecting the exceptional cases from the group consisting of a fire alarm, a partial deactivation of the transport system, or a complete deactivation of the transport system.

25. The method according to claim 18, which comprises, after a last available storage device in a specific production area has been reached, overwriting a destination information in the information medium of the item by the storage device with a next production area if no storage location was found in the original production area.

* * * * *